United States Patent [19]

Lane et al.

[11] Patent Number: 4,894,352

[45] Date of Patent: Jan. 16, 1990

[54] DEPOSITION OF SILICON-CONTAINING FILMS USING ORGANOSILICON COMPOUNDS AND NITROGEN TRIFLUORIDE

[75] Inventors: Andrew P. Lane, Westminster; Douglas A. Webb, Allen; Gene R. Frederick, Mesquite, all of Tex.

[73] Assignee: Texas Instruments Inc., Dallas, Tex.

[21] Appl. No.: 263,162

[22] Filed: Oct. 26, 1988

[51] Int. Cl.$^4$ .................... H01L 21/00; H01L 21/02; H01L 21/56; H01L 21/425

[52] U.S. Cl. .................................... 437/238; 437/235; 437/225; 204/192.25; 427/39; 148/DIG. 114; 148/DIG. 118; 252/372

[58] Field of Search ............... 437/225, 228, 235, 238, 437/920; 148/DIG. 114, DIG. 118, DIG. 122; 204/192.12, 192.15, 192.25; 427/39; 252/372, 374, 376

[56] References Cited

U.S. PATENT DOCUMENTS

| | | | |
|---|---|---|---|
| 4,526,631 | 7/1985 | Silvestri et al. | 437/97 |
| 4,532,150 | 7/1985 | Endo et al. | 427/38 |
| 4,554,047 | 11/1985 | Cook et al. | 204/192.32 |
| 4,641,420 | 2/1987 | Lee | 437/180 |
| 4,737,379 | 4/1988 | Mort et al. | 357/2 |
| 4,748,131 | 5/1988 | Zietow | 437/24 |
| 4,791,005 | 12/1988 | Becker et al. | 437/240 |
| 4,828,369 | 5/1989 | Hotomi | 350/357 |

FOREIGN PATENT DOCUMENTS

| | | | |
|---|---|---|---|
| 0062328 | 5/1981 | Japan | 437/238 |
| 0158672 | 8/1985 | Japan | 437/238 |
| 2062962 | 5/1981 | United Kingdom | 437/238 |

OTHER PUBLICATIONS

Morosamu, C., Thin Film Preparation by Plasma and Low Pressure CVD in a Horizontal Reactor, Vacuum, vol. 31, no. 7, pp. 309-313, 1981.
Livengood R., Plasma Enhanced Chemical Vapor Deposition of Fluorinated Silicon Nitride, using SiH$_4$-NH$_3$-NF$_3$ mixtures, Appl. Phys. Lett. 50(10), 9 Mar. 1987.
Chang C., Fluorinated Chemistry for High-Quality, Low Hydrogen Plasma-Deposited Silicon Nitride Films, J. Appl. Phys. 62(4), 15 Aug. 1987.
Seto D., Vapor Deposition of Silicon Dioxide, IBM Tech, Discl. Bull., vol. 9, no. 7, Dec. 1966, p. 747.
Thermal Oxidation of Silicon in an Afterglow Gas—ECS Atlanta, May 1988, A. H. Hoff and J. Ruzyllo.
Doped Silicon Etchcing by Chlorine and PTEOS Oxide Deposition, some recent results, Abstract AT&T Bell Labs., New Jersey.
Fluorinated Chemistry for High-Quality, Low Hydrogen Plasma-Deposited Silicon Nitride Films, Chom-P-ing et al., 08/15/67 AT&T Bell Labs., New Jersey.
Studies of Silicon Dioxide Films Produced from the Decomposition of TEOS and TMCTS by Various Processing Techniques, Camp et al., Texas Instruments, Oct. 1988.
Flamm et al., "A New Chemistry for Low Hydrogen PECVD Silicon Nitride" Solid State Technology, Mar. 1987, pp. 43-44.

*Primary Examiner*—Brian E. Hearn
*Assistant Examiner*—B. Everhart
*Attorney, Agent, or Firm*—B. Peter Barndt; James T. Comfort; Melvin Sharp

[57] ABSTRACT

In a low-pressure reactor, the addition of nitrogen trifluoride to a gaseous organosilicon compound such as tetraethoxysilane (TEOS) or tetramethylcyclotetroxysilane (TMCTS) results in surprisingly enhanced silicon dioxide deposition rates. The oxide deposited using this process also has the capability of filling features having aspects ratios up to at least 1.0, and may exhibit low mobile ion concentrations. The process is also applicable for depositing other silicon-containing films such as polysilicon and silicon nitride.

40 Claims, 2 Drawing Sheets

DEPOSITION OF SILICON-CONTAINING FILMS USING ORGANOSILICON COMPOUNDS AND NITROGEN TRIFLUORIDE

TECHNICAL FIELD OF THE INVENTION

The present invention relates in general to processes and compositions for depositing silicon-containing films such as silicon dioxide and silicon nitride, and more particularly relates to a process and composition for depositing such silicon-containing films using nitrogen trifluoride as a reactant.

BACKGROUND OF THE INVENTION

Over the past twenty years, tetraethoxysilane (TEOS) has been extensively used as a liquid source for the deposition of silicon dioxide. Low pressure chemical vapor deposition (LPCVD) techniques have in general been employed in which TEOS is thermally decomposed at approximately 725° C. in the presence of oxygen. More recently, plasma-enhanced chemical vapor deposition (PECVD) techniques, using either microwave or radio-frequency (rf) energy sources, have been employed to facilitate the decomposition of TEOS in the presence of oxygen at temperatures down to 20° C.

For both LPCVD and PECVD techniques, the overall decomposition reaction can, in general, be represented by the following equation:

$$(C_2H_5O)_4Si + 12O_2 \xrightarrow{\Delta E} 8CO_2 + 10H_2O + SiO_2$$

If this oxidation process is incomplete, carbon monoxide may also be a product and the resulting oxide films may contain mobile ions such as carbon, hydroxyl and silicon-hydrogen groups.

As disclosed in co-pending Patent Application Ser. No. 07/133,757 filed 12/17/87, the compressive stress of silicon dioxide films using silane and nitrous oxide can be reduced by the addition of small amounts of fluorine-containing compounds such as $CF_4$, $SiF_4$, and $NF_3$ In the case of $SiF_4$, the deposition rate increased with increasing flow of the additive while with $NF_3$ the rate decreased. This latter observation is not surprising since it is well established that $NF_3$ is an excellent oxide etchant that produces •$NF_2$ and •F radicals in an rf plasma environment.

For single-wafer plasma-enhanced chemical vapor deposition (PECVD) systems, it is essential to have a high deposition rate, usually above about 3000 Angstroms per minute, in order to compete with batch systems. This is conventionally obtained using pressures of two torr and higher. However, these relatively high pressures result in extensive gas phase nucleation and cause a "snow" of $SiO_2$ throughout the reaction chamber. The tendency to create "snow" has conventionally been counteracted by elaborate inert gas "curtains" to confine the deposition, together with frequent in-situ cleaning of the chamber. The conventional low pressure reaction is very clean, but the deposition rate is unacceptable for single-wafer reactors. Therefore, a need has arisen for a clean, single wafer, PECVD system for the deposition of $SiO_2$ with an acceptably high deposition rate.

SUMMARY OF THE INVENTION

One aspect of the present invention comprises a process for depositing a layer of a silicon-containing compound on a wafer. The wafer is disposed in a chamber evacuated to a low pressure, such as a pressure less than about eight torr. At least two gas reactants are introduced to the chamber, including a gaseous organosilicon compound and nitrogen trifluoride. These reactants will deposit the silicon-containing compound on the wafer at a rate that is enhanced over the deposition rate that would be obtained without using nitrogen trifluoride. Given the reduction in deposition rate reported by us for the use of nitrogen trifluoride with of silane and nitrous oxide, the enhancement of the deposition rate with the use of nitrogen trifluoride is a surprising result.

The above process has application to the deposition of silicon dioxide, silicon nitride and polysilicon. Where silicon dioxide is the depositing film, it is preferred that the organosilicon compound comprise an organosiloxane such as tetraethoxysilane (TEOS) or an alkyl cyclosiloxane such as tetraethylcyclotetrasiloxane or tetramethylcyclotetrasiloxane.

It is further preferred that oxygen be introduced into the chamber together with the organosilicon compound and nitrogen trifluoride reactant, as further enhancements in the deposition rate have been observed with this additive. In one embodiment, the oxygen introduced in the chamber may first be bubbled through a TEOS liquid, with vaporized TEOS being carried into the chamber by oxygen. The energy for the chemical reaction necessary for film deposition can be lent to the reactants through the formation of a plasma by radio frequency, microwave or magnetically enhanced techniques. Alternatively, the deposition can proceed thermally using low-pressure chemical vapor deposition (LPCVD).

It has been found that the introduction of between four and 70 volumetric percent of nitrogen trifluoride to a mixture including from two to 70 volumetric percent organosilicon compound results in an enhanced deposition rate. In the case of TMCTS, at least a five to one molar ratio of $NF_3$ to TMCTS is preferred to obtain the optimum deposition rate. For TEOS, a molar ratio of $NF_3$ to TEOS of at least ten to one is preferred for a good deposition rate in excess of 5000 Angstroms per minute at presures below 1 torr. Oxygen may be introduced into the chamber in an amount ranging between 25 and 90 percent by volume.

In another aspect of the invention, the process may be carried out at pressures below 1.0 torr to achieve the filling of topographical features having high aspect ratios. Aspect ratios of topographical features filled by conventional TEOS systems measure no more than 0.7 to 0.8. On the other hand, according to the process of the invention, a filling of features having aspect ratios in excess of 1.0 can be obtained with a film of good structural integrity. The use of $NF_3$ as a reactant may also lower mobile ion concentration and surface-state charge density in the deposited film.

BRIEF DESCRIPTION OF THE DRAWINGS

Further aspects of the invention and their advantages may be discerned with the aid of the following detailed description taken in conjunction with the drawings in which.

DETAILED DESCRIPTION OF THE INVENTION

Figure 1:
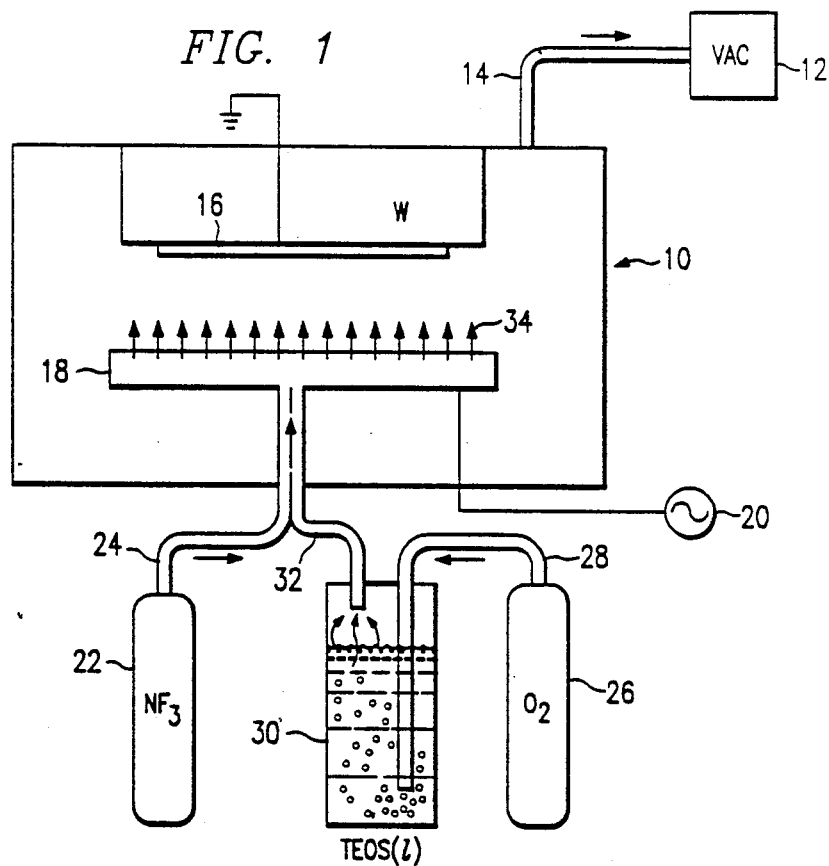
FIG. 1 is a schematic diagram of a plasma-enhanced chemical vapor deposition reactor and associated equipment according to the invention.

FIG. 1 is a schematic representation of apparatus to carry out the invention, the apparatus preferably including a plasma-enhanced chemical vapor deposition (PECVD) reactor shown generally at 10. Chamber 10 is hermetically sealed and is evacuated by a vacuum pump 12 connected to the interior of chamber 10 by a vacuum line 14. The interior of chamber 10 is evacuated to a pressure in the range from about 0.4 to about 8 torr. Inside the reactor vessel 10, a wafer W is attached by clips or the like (not shown) to a grounded plate 16. Plate 16 is suspended over a "shower head" manifold 18 that is connected to an rf energy source 20. It is preferred that plate 16 be heated. While the illustrated embodiment involves the use of an rf-generated plasma, the invention also has application to reactors in which a plasma is generated by other means, such as magnetically-assisted rf or microwave, and further applies to non-plasma reactors such as a low-pressure chemical vapor deposition (LPCVD) reactor.

A source 22 of nitrogen trifluoride is connected as by means of a tube 24 to the manifold 18. A tank 26 of oxygen is connected through a tube 28 to the bottom of a vessel 30 that contains an amount of tetraethoxysilane (TEOS) in liquid form. In other embodiments, the TEOS can be replaced with another alkyl oxysilane or an alkyl cyclosiloxane, such as 1,3,5,7 tetraethylcyclotetrasiloxane (TECTS) or 1,3,5,7 tetramethylcyclotetrasiloxane (TMCTS).

Oxygen bubbles out of tube 28 and picks up TEOS vapor. The oxygen carries TEOS vapor with it through a tube 32 to the shower head manifold 18, where the TEOS mixes with the nitrogen trifluoride gas provided by tube 24. This mixture then exits the manifold 18 as shown by arrows 34. The rf energy applied to the manifold 18 causes a plasma to be generated in a space between the shower head 18 and the wafer W.

In another embodiment, the TEOS may be introduced directly into the manifold 18 as a vapor instead of being carried by the oxygen from tank 26. While it is preferred that oxygen be used in the reaction mixture, it is not absolutely essential. Further, a carrier gas for the TEOS may comprise any other inert gas such as helium, argon or nitrogen. Suitable valves and meters (not shown) are used to control the flow rates of the reactants into the chamber 10.

EXAMPLE I

A series of sixteen Experiments were performed to demonstrate the effectiveness of nitrogen trifluoride in increasing the deposition rate of silicon dioxide from TEOS. The results of these experiments and their parameters are set out in Table I.

TABLE I

| Exp. No. | $O_2$ Flow, sccm | F. Flow, sccm | Pressure, torr | rf Power, watts | Bubbler/ Vapor | Depos. Rate. Å/min. | Refr. Index |
|---|---|---|---|---|---|---|---|
| 1. | 175 | 0 | 2 | 230 | Bubbler | 2,850 | 1.44 |
| 2. | 175 | $CF_4$/20 | 2 | 230 | Bubbler | 2,454 | 1.46 |
| 3. | 175 | $SiF_4$/20 | 2 | 230 | Bubbler | 2,922 | 1.44 |
| 4. | 175 | $NF_3$/20 | 2 | 230 | Bubbler | 13,721 | |
| 5. | 175 | 0 | 3 | 230 | Bubbler | 6,507 | |
| 6. | 175 | $NF_3$/32 | 3 | 230 | Bubbler | 16,611 | |
| 7. | 175 | 0 | 4 | 230 | Bubbler | 13,531 | |
| 8. | 175 | $CF_4$/20 | 4 | 230 | Bubbler | 13,369 | |
| 9. | 175 | $SiF_4$/20 | 4 | 230 | Bubbler | 13,411 | |
| 10. | 175 | $NF_3$/20 | 4 | 230 | Bubbler | 15,078 | |
| 11. | 30 | 0 | 0.6 | 50 | Vapor | 1,316 | 1.43 |
| 12. | 0 | $NF_3$/5 | 0.6 | 50 | Vapor | 2,295 | 1.45 |
| 13. | 5 | $NF_3$/5 | 0.6 | 50 | Vapor | 2,869 | |
| 14. | 0 | $NF_3$/7 | 0.6 | 50 | Vapor | 2,922 | |
| 15. | 0 | $NF_3$/10 | 0.6 | 50 | Vapor | 3,455 | |
| 16. | 0 | $NF_3$/20 | 0.6 | 50 | Vapor | 5,041 | 1.42 |

For the first ten experiments, TEOS was introduced into a single-wafer PECVD reactor at a flow rate of approximately ten standard cubic centimeters/minute (sccm). The flow rate of TEOS for the last six experiments in the range of three to five sccm. In a first, control experiment, no fluorine source was used at all. The power applied to the shower head electrode was 230 watts and oxygen was bubbled through the bubbler at a flow rate of about 175 sccm. Pressure was held at two torr. The deposition rate thus achieved was 2850 Angstroms per minute.

Experiments 2 and 3 were similar to Experiment 1, except for the addition of non-nitrogenated fluorine sources, such as tetrafluoromethane and tetrafluorosilane. These fluorine sources had relatively little effect on the oxide deposition rate.

In the fourth experiment, nitrogen trifluoride was introduced into the reactor at 20 sccm, or at a molar ratio with respect to the TEOS in the range of about 4:1 to 7:1. As may be seen, the deposition rate increase is dramatic. In view of the negative influence that nitrogen trifluoride has on silane as a silicon-depositing source, this dramatic increase in deposition rate was surprising.

Experiments 5 and 6 were carried out at a pressure of three torr, with Experiment 5 having no fluorine source while Experiment 6 introduced nitrogen trifluoride at 32 sccm. The difference in oxide deposition rate was over 10,000 Angstroms per minute.

Experiments 7 through 10 were conducted at a pressure of four torr. Experiment 7 used no fluorine source at all, while Experiments 8 and 9 introduced 20 sccm of tetrafluoromethane and tetrafluorosilane, respectively. As in the case of the experiments conducted at two torr, there was little effect on the deposition rate by these two fluorine sources Once again, as shown by Experiment 10, a substantial increase in deposition rate was noted when nitrogen trifluoride was used as the fluorine source.

Experiments 11 through 16 were conducted at a substantially reduced pressure of 0.6 torr. A base deposition rate without any fluorine source was established by Experiment 11 at about 1300 Angstroms per minute. This deposition rate is too low to be competitive with batch reactors. Experiments 12 through 16 added increasing amounts of nitrogen trifluoride. With no oxygen, a dramatic increase in the deposition rate was recorded for nitrogen trifluoride at only 5 sccm, as is shown for Experiment 12. The addition of 5 sccm oxygen somewhat enhances the deposition rate further, as shown by Experiment 13. Further advances in deposition rate were noted by further increases in the nitrogen trifluoride flow rate. A deposition rate in excess of 5000 Angstroms per minute were noted when the flow rate of nitrogen trifluoride was approximately 20 sccm, roughly corresponding to a molar ratio of about five to one with respect to the TEOS.

While the exact decomposition mechanism leading to these enhanced deposition rates is not fully understood, it is likely that atomic fluorine is consumed by extraction of hydrogen from the alkyl groups on the organosilicon compounds. This could explain why the fluorine does not appear to etch the film deposited. The failure of $CF_4$ and $SiF_4$ a significant effect in deposition rate implies that some fragment of $NF_3$ is involved other than fluorine itself, such as $NF_2$. The atomic ratio of oxygen to silicon for these films is shown by Rutherford Back Scattering (RBS) to be 2:1 as expected for a silicon dioxide film. Fluorine was, however, not detected in the RBS tests. Infrared transmission spectra of several films deposited with $NF_3$ showed the expected bands for $SiO_2$.

Figure 2:
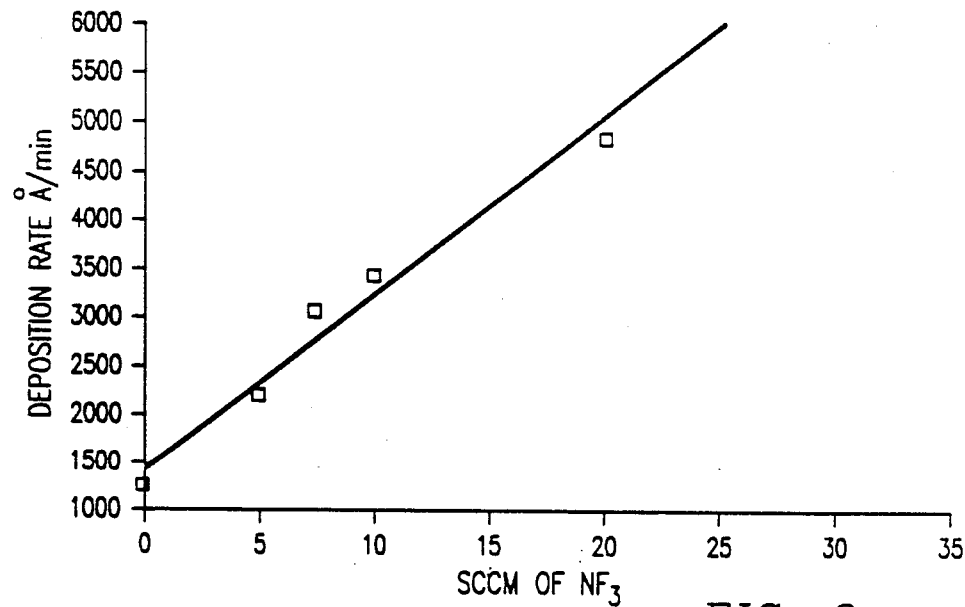
FIG. 2 is a graph of silicon dioxide deposition rate versus flow rate of nitrogen trifluoride with TEOS used as a gaseous organosilicon reactant.

The data for Experiments 12, 14, 15 and 16 are plotted in the graph shown in FIG. 2. This graph discloses a linear relationship between the flow rate of nitrogen trifluoride and the deposition rate of silicon dioxide up to a ten to one molar ratio of NF to TEOS.

EXAMPLE II

TMCTS was used as the organosilicon gaseous compound and was introduced into the same LPCVD reactor with nitrogen trifluoride. An oxygen flow rate was established at 158 sccm. The TMCTS flow rate was metered at between four and five sccm. Rf power was applied to the shower head manifold at 150 watts, and the pressure was held at 0.55 torr.

Figure 3:
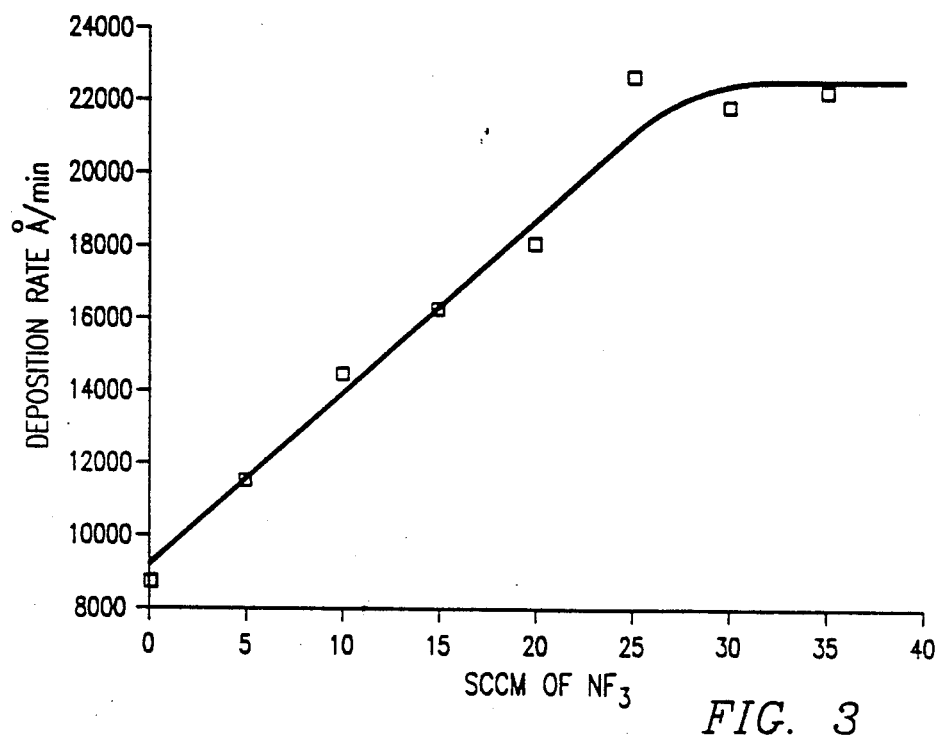
FIG. 3 is a graph of silicon dioxide deposition rate versus flow rate of nitrogen trifluoride where TMCTS is used as a gaseous organosilicon reactant.

The results of a series of experiments with these conditions are graphed in FIG. 3. Again, a linear relationship is established between the deposition rate and the flow rate of $NF_3$ up to approximately 25 sccm, or up to approximately a five to one molar ratio of $NF_3$ to TEOS. The curve thereafter flattens out, with very similar deposition rates being noted for 30 and 35 sccm of $NF_3$.

Figure 4:
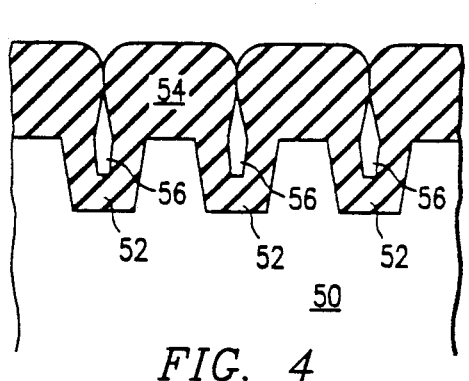
FIG. 4 is a schematic sectional view of a wafer having high-aspect-ratio features and an oxide film deposited thereon by a process according to the prior art.

The invention also allows the filling of topographical features having a higher aspect ratio that has been conventionally possible FIG. 4 is a highly magnified schematic cross sectional view of a silicon wafer 50 having a plurality of trenches 52 formed therein. An oxide layer 54 was deposited on the wafer 50 from TEOS according to a conventional process. A plurality of voids 56 were formed such that the trenches 52 were not completely filled. The limit of aspect ratios of topographical features capable of being filled by conventional TEOS processes has been found to be in the range of 0.7 to 0.8, where the aspect ratio is calculated as the ratio of depth over width of the feature. The oxide layer 54 produced in FIG. 3 was produced with a flow rate of approximately ten sccm of TEOS and 175 sccm of $O_2$, but without any nitrogen trifluoride being introduced into the reactor.

Figure 5:
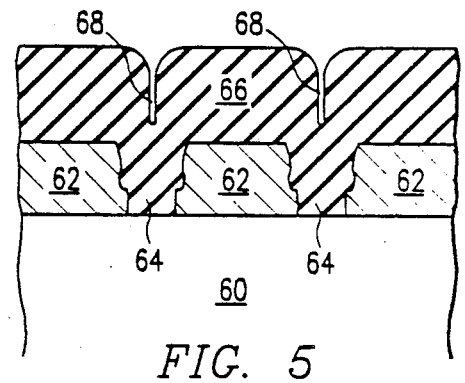
FIG. 5 is a schematic cross sectional view of a wafer having high-aspect-ratio features and an oxide film deposited thereon according to the invention.

FIG. 5 is a highly magnified schematic cross sectional view of a silicon substrate 50 on which a plurality of metal leads 62 have been deposited. A plurality of trenches 64 are formed in between the metal lead 62 that have aspect ratios of approximately 1:1. A layer 66 of oxide was deposited on this structure in a PECVD reactor with a flow rate of 175 sccm of oxygen, 10 sccm TEOS and 10 sccm nitrogen trifluoride. As is seen, the trenches 64 were completely filled with the oxide 66, with voids 68 only occurring well above the trenches 64.

This enhanced capability to fill high aspect ratio features may result because the oxide deposition with $NF_3$ is more anisotropic. Therefore, there is a reduced sidewall deposition. Aspect ratios up to at least 1.0 can be filled with oxide of good integrity, using $O_2$ to $NF_3$ ratios of less than about 6:1, and more preferably about 3:1.

The present invention has general application to any deposition system using an organosilicon compound that contains an aliphatic C—H group. Organosilicon sources for $Si_3N_4$ and polysilicon films are chemically similar to those for the oxide thin films above discussed. Hence, the addition of $NF_3$ to the reaction mixture is expected to enhance deposition rates for these types of films also. Alternative energy sources for making plasma include microwave-induced remote plasma and magnetically enhanced plasmas by magnetron or electron cyclotron resonance. Where a silicon nitride film is desired to be deposited, ammonia, nitrogen or another source of nitrogen is also introduced into the reactor to obtain the required stoichiometry.

In summary, a novel process for depositing silicon-containing films that enhance deposition rates has been discovered that employs the use of nitrogen trifluoride in conjunction with organosilicon gaseous compounds. At low pressures, the process also results in filling topographical features having higher aspect ratios than have been heretofore achieved.

While certain preferred embodiments have been described above together with their advantages, the invention is not limited thereto but only by the spirit and scope of the appended claims.

What is claimed is:

1. A composition for depositing a layer of silicon-containing compound on a substrate within a low-pressure reactor, comprising:
   between about four and about seventy percent by volume of an organosilicon gas compound; and
   between about two percent and about seventy percent by volume of nitrogen trifluoride.
2. The composition of claim 1, wherein said organosilicon gas compound comprises an organosiloxane.

3. The composition of claim 2, wherein said organosiloxane comprises tetraethoxysilane.

4. The composition of claim 3, wherein the molar ratio of nitrogen trifluoride to tetraethoxysilane is at least four to one.

5. The composition of claim 2, wherein said organosilicon gas compound comprises an alkylcyclosiloxane.

6. The composition of claim 5, wherein said alkylcyclosiloxane comprises a tetraethylcyclotetrasiloxane.

7. The composition of claim 5, wherein said alkylcyclosiloxane comprises a tetramethylcyclotetrasiloxane.

8. The composition of claim 7, wherein the molar ratio of nitrogen trifluoride to tetramethylcyclotetrasiloxane is at least about five to one.

9. The composition of claim 1, wherein said layer of silicon-containing compound comprises polysilicon.

10. The composition of claim 1, wherein said layer of silicon-containing compound comprises silicon nitride.

11. The composition of claim 10, and further comprising a third gas having a formula including nitrogen.

12. The composition of claim 10, wherein said third gas is selected from the group consisting of ammonia and nitrogen.

13. The composition of claim 1, and further comprising between about 25% and 85% by volume of oxygen.

14. A process for depositing a layer of a silicon-containing compound on a wafer, comprising the steps of:
disposing the wafer in a chamber evacuated to a low pressure;
introducing a gaseous organosilicon compound into the chamber;
introducing nitrogen trifluoride into the chamber;
responsive to said steps of introducing the organic compound and nitrogen trifluoride into the chamber, reacting the gaseous organosilicon compound and the nitrogen trifluoride; and
responsive to said step of reacting, depositing the silicon-containing compound on the wafer at a rate greater than a corresponding deposition rate obtained without using nitrogen trifluoride.

15. The process of claim 14, and further comprising the step of regulating the pressure inside the chamber to be no more than about four torr.

16. The process of claim 15, and further comprising the step of regulating the pressure inside the chamber to be less than about 1.0 torr.

17. The process of claim 14, and further comprising the step of depositing the silicon-containing compound at a rate of more than 5000 Angstroms per minute.

18. The process of claim 14, and further comprising the step of introducing oxygen into the chamber.

19. The process of claim 18, and further comprising the steps of:
bubbling oxygen through a liquid organosilicon compound;
vaporizing the organic liquid compound into the oxygen to yield the gaseous organosilicon compound; and
carrying the gaseous organosilicon compound into the chamber with the oxygen.

20. The process of claim 14, wherein the silicon-containing compound comprises silicon dioxide, the organic gaseous compound comprising an organosiloxane.

21. The process of claim 20, wherein the organosiloxane comprises tetraethoxysilane.

22. The process of claim 20, wherein the organosiloxane comprises an alkylcyclosiloxane.

23. The process of claim 22, wherein the alkylcyclosiloxane comprises tetraethylcyclotetrasiloxane.

24. The process of claim 23, wherein the alkylcyclosiloxane comprises tetramethylcyclotetrasiloxane.

25. The process of claim 14, and further comprising the step of creating a plasma in order to react the introduced gases.

26. The process of claim 25, and further comprising the step of generating the plasma with radio frequency energy.

27. The process of claim 26, and further comprising the step of generating the plasma with microwave energy.

28. The process of claim 25, and further comprising the step of generating a magnetically enhanced plasma.

29. The process of claim 14, and further comprising the step of depositing the silicon-containing compound using low pressure chemical vapor deposition.

30. The process of claim 14, and further comprising the steps of:
introducing the nitrogen trifluoride into the chamber in amounts ranging from four to seventy percent by volume; and
introducing the gaseous organosilicon compound into the chamber in amounts ranging from about two to about seventy percent by volume.

31. The process of claim 14, and further comprising the steps of:
introducing a second nitrogen-containing gas into the chamber; and
depositing the layer on the wafer to include silicon nitride.

32. A process for depositing a silicon-containing compound on a wafer, comprising the steps of:
disposing the wafer in a chamber evacuated to a low pressure;
introducing a gaseous organosilicon compound into the chamber;
introducing nitrogen trifluoride into the chamber;
responsive to said steps of introducing the organosilicon compound and the nitrogen trifluoride into the chamber, reacting the organosilicon compound and the nitrogen trifluoride to deposit the silicon containing compound on the wafer, such that the mobile ion concentration and the surface-state charge density of the layer will be lower than corresponding layers formed without the use of nitrogen trifluoride.

33. The process of claim 32, wherein said step of reacting comprises reacting an organosiloxane with the nitrogen trifluoride to deposit silicon dioxide.

34. A process for depositing a layer of silicon-containing compound on a wafer surface having topographical features of high aspect ratio, comprising the steps of:
disposing the wafer in a chamber evacuated to a pressure below about one torr;
introducing a gaseous organosilicon compound into the chamber;
introducing nitrogen trifluoride into the chamber; and
reacting the organo silicon compound with the nitrogen trifluoride to deposit the layer of silicon-containing compound on the surface such that voids in the layer are not formed.

35. The process of claim 34, and further comprising the step of filling topographical features on the wafer having an aspect ratio greater than or equal to 1.0.

36. The process of claim 34, wherein said gaseous organosilicon compound comprises an organosiloxane, said silicon-containing compound comprising silicon dioxide.

37. The process of claim 36, wherein said gaseous organosilicon compound comprises tetraethoxysilane.

38. The process of claim 36, wherein said organosilicon compound comprises an alkylcyclosiloxane.

39. The process of claim 34, and further comprising the step of introducing oxygen into the chamber.

40. The process of claim 39, and further comprising the step of introducing the oxygen and the nitrogen trifluoride into the chamber in a volumetric ratio not exceeding about six to one.

* * * * *